United States Patent [19]

Hung et al.

[11] Patent Number: 5,073,537

[45] Date of Patent: Dec. 17, 1991

[54] ELECTRICALLY CONDUCTIVE ARTICLE

[75] Inventors: Liang-Sun Hung, Webster; Dilip K. Chatterjee, Rochester, both of N.Y.

[73] Assignee: Eastman Kodak Company, Rochester, N.Y.

[21] Appl. No.: 475,528

[22] Filed: Feb. 6, 1990

[51] Int. Cl.$^5$ .............................. B32B 9/00
[52] U.S. Cl. .......................... 505/1; 505/701; 505/702; 505/703; 505/704; 428/375; 428/212; 428/213; 428/332; 428/335; 428/337; 428/426; 428/432; 428/433; 428/688; 428/930
[58] Field of Search ................ 505/1, 701–704; 428/426, 432, 433, 688, 930, 156, 201, 304.4, 306.6, 307.3, 307.7, 375, 212, 213, 332, 335, 337

[56] References Cited

U.S. PATENT DOCUMENTS

| | | | |
|---|---|---|---|
| 4,897,378 | 1/1990 | Chiang | 505/1 |
| 4,921,833 | 5/1990 | Takano | 505/702 |
| 4,994,435 | 2/1991 | Shiga et al. | 505/704 |

Primary Examiner—Patrick J. Ryan
Attorney, Agent, or Firm—Carl O. Thomas

[57] ABSTRACT

An electrically conductive article is disclosed comprised of a support, a barrier and a heavy pnictide mixed alkaline earth copper oxide crystalline coating. The support is an austenitic metal alloy of chromium and one or more group VIII period 4 metals, and the barrier is comprised of a zirconia layer containing fissures and an oxide compatible with the electrically conductive crystalline layer located in the fissures.

13 Claims, 1 Drawing Sheet

ELECTRICALLY CONDUCTIVE ARTICLE

FIELD OF THE INVENTION

The invention relates to electrically conductive articles. In a more specific aspect the invention relates to electrically conductive articles that exhibit a relatively high superconducting onset transition temperature. Still more specifically this invention relates to articles that exhibit superconductivity at relatively high temperatures.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting onset transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials. The highest temperature at which superconductivity (i.e., zero resistance) can be measured in a material is referred to as $T_o$.

As herein employed the terms high superconducting onset transition temperature, high critical temperature and high $T_c$ are employed interchangeably to indicate a material having a superconducting onset transition temperature of greater than 80° C.

Agostinelli et al U.S. Ser. No. 359,306, filed May 31, 1989, titled CONDUCTIVE ARTICLES AND PROCESSES FOR THEIR PREPARATION, commonly assigned, now U.S. Pat. No. 4,950,643, (European patent application 0 334 093, published Sept. 27, 1989, corresponding) discloses electrically conductive articles in which a crystalline heavy pnictide mixed alkaline earth copper oxide is formed on a substrate. The articles exhibit high critical temperatures and superconductivity when the substrate presents a perovskite crystal structure as a coating surface (e.g. a strontium titanate coating surface) or a magnesia or alumina coating surface. To avoid reduction of $T_c$ by less compatible substrates Agostinelli et al proposes the use of barrier layers between the crystalline superconductive oxide layer and the substrate. Suggested barriers include magnesia, a group 4 metal oxide or silicide (particularly zirconia), silver, gold or a platinum metal.

What the art has been sought without success are articles in which superconductive copper oxide coatings are present on supports of non-precious metals, particularly period 4 metals.

In Applicants' concurrently filed, commonly assigned patent application, U.S. Ser. No. 475,527, titled ELECTRICALLY CONDUCTIVE ARTICLE (I), an article is disclosed comprised of support, a barrier and an electrically conductive heavy pnictide mixed alkaline earth copper oxide crystalline coating. The support is an austenitic metal alloy of chromium and one or more group VIII period 4 metals, and the barrier is comprised of a high density hafnia layer.

SUMMARY OF THE INVENTION

In one aspect this invention is directed to an article comprised of a support, a barrier and an electrically conductive heavy pnictide mixed alkaline earth copper oxide crystalline coating, characterized in that the support is comprised of an austenitic alloy of chromium and one or more group VIII period 4 metals and the barrier is comprised of a zirconia layer containing fissures and an oxide compatible with crystallization of the heavy pnictide mixed alkaline earth copper oxide in an electrically conductive form located in the fissures.

By selection of the crystalline coating, the substrate and a combination of barrier materials electrically conductive articles, including those having relatively high $T_c$ levels and those exhibiting superconducting properties, are achieved using alloys of the non-precious metals that are economically attractive and have the capability of fabrication in varied structural forms. For example, the selected substrate materials particularly lend themselves to the fabrication of flexible articles, such as conductive tapes and wire. By selection a conductive cuprate layer has been identified that has thermal requirements for crystallization within the capability of the substrate to resist oxidation. Since the conductive cuprate layer cannot be successfully crystallized into an electrically conductive form when it direct contact with the substrate, the invention has further required the identification of a combination of barrier materials capable of protecting the conductive cuprate layer from substrate contamination. The barrier materials are demonstrated in the examples below to be ineffective when employed separately.

Dimensions of various features of the articles have been exaggerated for ease of visualization.

DESCRIPTION OF PREFERRED EMBODIMENTS

Figure 1:
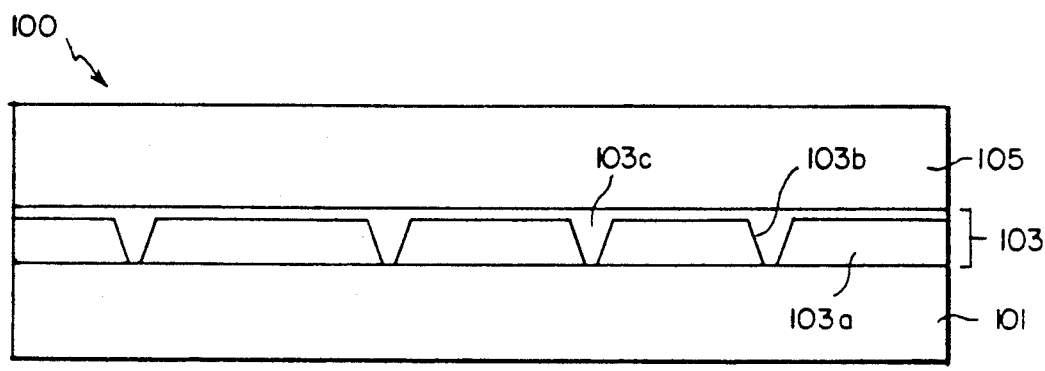
FIG. 1 is a schematic view of an article satisfying the requirements of the invention and FIG. 2 is a schematic view of an alternative embodiment.

Referring to FIG. 1 an article 100 satisfying the requirements of the invention is shown. The article consists of an austenitic metal alloy support 101, a barrier 103, and an electrically conductive heavy pnictide mixed alkaline earth copper oxide crystalline coating 105. The barrier is comprised of a zirconia layer 103a containing fissures 103b and an oxide 103c compatible with the conductive oxide coating filling the fissures.

Figure 2:
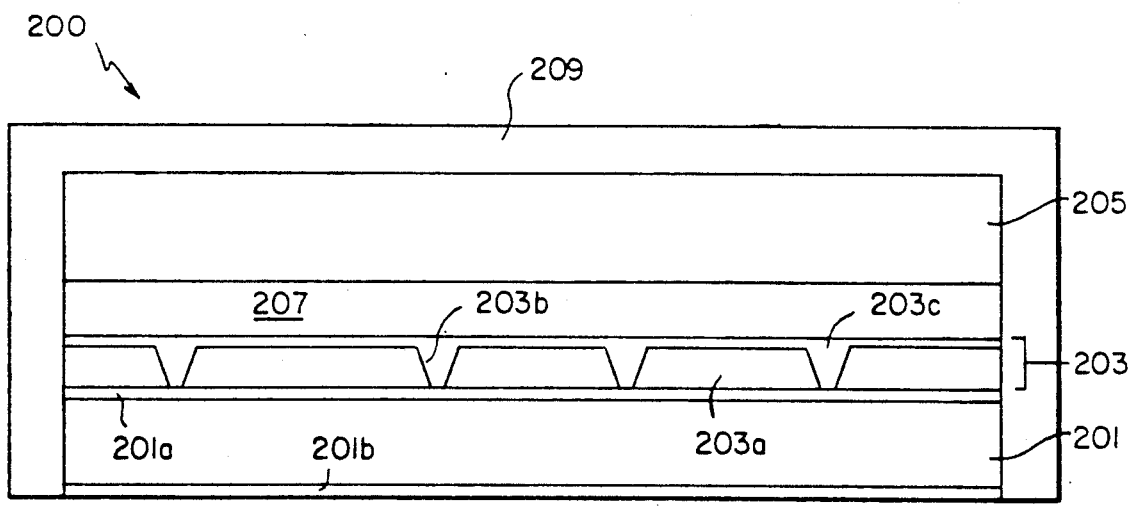

Another embodiment of the invention is shown in FIG. 2. The article 200 consists of an austenitic metal alloy support 201, which has thin oxide layers 201a and 201b formed on its opposite faces during heating to temperatures required to crystallize the electrically conductive heavy pnictide mixed alkaline earth copper oxide coating 205. Interposed between the conductive coating and the support is barrier 203 having features 203a, 203b and 203c identical to corresponding features 103a, 103b and 103c, respectively, of barrier 103 and a layer 207 having as its purpose to facilitate crystallization of the conductive layer. An external coating 209 cooperates with the support to surround the electrically conductive crystalline layer to protect it against ambient contaminants, such as moisture.

The electrically conductive articles of this invention incorporate supports comprised of an austenitic alloy of chromium and one or more group VIII period 4 metals. Austenitic alloys exhibit a face centered cubic crystal lattice structure that renders the alloys more highly resistant to oxidation at high temperatures than other crystalline forms of these alloys. For facilitating article fabrication it is particularly contemplated to employ those alloys that resist oxidation when subjected to temperatures of at least 800° C. in air for up to 10 minutes. In practice the alloys may be subjected to even higher temperatures (e.g., 850° C. or more), but usually for somewhat shorter time periods.

The austenitic alloys resist oxidation by reacting slowly, if at all, with oxygen from ambient air. In some instances oxidation resistance can be attributed directly to a low initial and continued rate of oxidation of elemental metal. In other instances the formation of a thin surface oxide layer, seldom more than about a 1000 Å in thickness, acts as a passivant retarding or preventing further oxidation. In this instance the supports exhibit thin surface oxide layers corresponding to layers 201a and 201b, described above.

Oxidation resistant austenitic alloys have the common feature of containing chromium in combination with one or more group VIII period 4 metals-that is, at least one of iron, nickel and cobalt. Chromium concentrations range from about 5 to 30 percent. (Except as otherwise stated, all percentages are to be understood as being percent by weight, based on total weight.) Austenitic stainless steels typically contain from about 16 to 25 percent chromium and up to about 20 percent nickel, the balance being accounted for principally by iron with minor proportions of optional modifying metals often also being present. By displacing all or part of the iron with nickel, cobalt or a mixture of both, austenitic alloys can be formed known as superalloys. Superalloys in which the iron is wholly or partially replaced by nickel and cobalt, if present, is limited to 20 percent typically contain from 5 to 25 chromium while superalloys which contain up to 22 percent nickel with the balance of the group VIII metal being cobalt typically contain from about 19 to 30 percent chromium. Other, optional metals that are commonly included in the austenitic alloys to enhance various properties include one or both of molybdenum and tungsten in concentrations of up to 12 percent, often incorporated as carbides; one or both of aluminum and titanium in concentrations of up 6 percent, niobium in concentrations of up to 5 percent, often incorporated as a carbide; and tantalum in concentrations of up to 12 percent, often incorporated as a carbide. Manganese and silicon concentrations in austenitic stainless steels can range up to 20 percent, but are most commonly in the 1 to 5 percent range. In superalloys manganese and silicon, if present, seldom account for as much as 2 percent of the alloy. Nitrogen, carbon, phosphorus, sulfur, zirconium, boron and rare earths also are common ingredients at concentrations usually well below 1 percent.

Specific examples of suitable austenitic stainless steels are listed in the *Metals Handbook*, American Society for Metals, 1985, Table 3 at page 15-2 and Table 1 at page 16-2, the disclosure of which is here incorporated by reference. Specific examples of suitable austenitic superalloys are listed in the *Metals Handbook*, cited above, in Table 2, page 61-7, also incorporated by reference.

In addition to their resistance to oxidation at the high temperatures required to achieve crystallization of the electrically conductive oxide layer and at ambient temperatures, the austenitic alloys offer the advantage of being much more economical to use than the platinum metals, silver and gold. Further, the austenitic alloys permit supports to be fabricated that are both flexible and strong. The article supports can, for example, readily be fabricated in the forms of tapes or wires, allowing curved configurations, such as those required in winding and spooling, both before and after article fabrication. While the austenitic alloy supports can be of any thickness convenient for their intended application, for use in flexible form, such as a tape, support thicknesses in the range of from about 5 to 500 $\mu$m, preferably 20 to 300 $\mu$m, are contemplated.

If it is attempted to coat and crystallize the electrically conductive crystalline oxide layer while in direct contact with the austenitic alloy surface of the support, degradation of electrical conduction properties occur. It is, for example, impossible to achieve a high $T_c$ or superconductive crystalline oxide layer when heating of the oxide layer to its crystallization temperature is undertaken with the oxide layer in direct contact with the austenitic alloy of the support.

It is therefore contemplated to interpose a barrier between the austenitic alloy support and the electrically conductive crystalline oxide layer. Zirconia and magnesia are two materials that have been used successfully both as separate supports for electrically conductive crystalline cuprate layers and as barrier layers between ceramic supports and these layers. Attempts to form a magnesia layer on the austenitic alloy support that is capable of withstanding heating to the crystallization temperatures necessary to form the electrically conductive crystalline cuprate layer have been unsuccessful. Because of the extreme mismatch in thermal coefficients of expansion the magnesia spalls from the autenitic alloy support on heating.

Zirconia when formed as a barrier layer on the austenitic alloy support also spalls. However, it has been observed that when the thickness of the zirconia is limited to about 2.5 $\mu$m or less, the zirconia does not spall from the support, but merely cracks on cycling to elevated temperatures, leaving a pattern of fissures which can be observed by microscopic examination techniques. It has been further discovered that by filling the fissures with an oxide that is compatible with crystallization of the cuprate oxide in its electrically conductive form an effective composite barrier is produced.

It is preferred to form the zirconia portion of the barrier by first forming a zirconia layer that, prior to heating on the austenitic alloy support to temperatures that produce fissures, is as nearly free of fissures as possible. As employed herein, the term "fissures" includes all breaks, cracks, pores and other discontinuities opening to the surface of the zirconia layer. Since the fissures in the zirconia layer are subsequently filled to complete the composite barrier, it is appreciated that a wide variety of techniques for forming zirconia layers can be employed. The zirconia layer can, for example, be formed by the electron deposition of zirconia, by depositing zirconium and then oxiding the zirconium, and by depositing the zirconium as an organic compound that is decomposed by heating to leave a zirconia coating. This latter technique can be practiced by employing zirconium in metalorganic depositions of the type disclosed in EPO 0 334 093, cited above. It is, however, preferred to employ deposition techniques which minimize the presence of fissures, except those that unavoidably formed by cycling to elevated temperatures.

The zirconia barrier layer can be deposited in any convenient thickness capable of providing a continuous coating. For ideally smooth support coating surfaces thicknesses of at least about 2000 Å are necessary to achieve a continuous layer. In practice, the surface roughness of the support can significantly increase the thickness of the zirconia layer required to insure separation of the support and the electrically conductive crystalline oxide coating. For an unpolished austenitic alloy support surface a barrier layer thickness of about 1 μm is preferred to insure reliable separation of the support and conductive crystalline oxide coating.

After the zirconia layer is formed, it is heated to produce the fissures necessary to relieve the stress created by the differential between the coefficients of expansion of zirconia and the austenitic alloy support. Although temperatures of at least about 800° C. are required to crystallize the conductive cuprate layer, heating to temperatures of only about 550° to 600° C. are required to form the pattern of stress relief fissures in the zirconia layer.

Once the zirconia layer is formed and thermally stressed to create the pattern of fissures, formation of the composite barrier layer is completed by filling the fissures with an oxide compatible with achieving the intended crystallization and electrical conduction properties in the cuprate layer. Generally any oxide can be employed known to present a surface, either as a support or barrier layer on a ceramic support, on which the cuprate layer can be formed in its electrically conductive crystalline formed. Exemplary compatible oxides include magnesia (MgO), strontium titanate ($SrTiO_3$), lanthanum aluminate ($LaAlO_3$), and potassium tantalate ($KTaO_3$). It is also contemplated to employ hafnia, zirconia or a mixture of both as a compatible oxide.

A preferred technique for filling the fissures with the compatible metal oxide is to spin coat a solution containing the metal or metals of the metal oxide to be deposited in the form of metalorganic compounds, such as metal alkyls, alkoxides, β-diketone derivatives and metal salts of organic acids—e.g., carboxylic acids. The metalorganic compound or compounds are dissolved in a film forming solvent which optionally additionally contains a film promoting agent, such as a branched chain hydrocarbon (e.g., rosin). The organic ligands of the metalorganic compounds and the film promoting agents preferably contain up to about 30 carbon atoms, with from 6 to 20 carbon atoms being specifically preferred. Preferred ligands, film forming agents and solvents for the spin casting procedure described above are disclosed by Mir et al U.S. Pat. No. 4,880,770, the disclosure of which is here incorporated by reference.

After forming the solution containing the metalorganic compound or compounds, the solution is spin cast onto the fissured zirconia layer. Preferably an excess of the solution is cast so that it can fill the fissures and also form a thin continuous layer over the zirconia. After spin casting the solution is heated to temperatures sufficient to volatilize the solvent and organic components, leaving behind the compatible oxide in the fissures and as a thin coating on the zirconia. Any convenient volatilization temperature can be employed. Volatilization temperatures need not about 600° C. If desired to insure filling of the fissures, the spin casting and heating procedure can be repeated, although this has not been found necessary. The compatible oxides preferably increase the thickness of the barrier by an increment of about 1000 to 3000 Å. In other words, the compatible oxide preferably forms a thin continuous layer over the surface of the zirconia.

Onto the novel composite barrier layer is coated a heavy pnictide mixed alkaline earth copper oxide (hereinafter also referred to by the acronym PAA'C oxide) that is converted by heating after coating into a crystalline electrically conductive layer. PAA'C oxides are one class of a variety of cuprate oxides observed to exhibit relatively high $T_c$ and superconductivity characteristics, including rare earth alkaline earth copper (RAC) oxides, including those exhibiting $K_2NiF_4$, 1-2-3 (that is, $R_1A_2C_3$) and 1-2-4 (that is, $R_1A_2C_4$) crystal structures as well as thallium mixed alkaline earth copper (TAA'C) oxides, such as 2-2-2-3 thallium calcium barium copper oxide, reported to have a $T_c$ of 125° C., the highest reproducible $T_c$ reported to this date.

The selection of PAA'C oxides to form the crystalline conductive layer of the articles of this invention is advantageous in view of their relatively high onset transition superconductivity temperatures in their 2-2-1-2 and 2-2-2-3 crystalline forms. However, selection of an electrically conductive crystalline oxide coating based on $T_c$ alone would not lead to selection of PAA'C oxides, since at least the thallium class of cuprates are known to have higher $T_c$ characteristics.

PAA'C oxides satisfy the requirements of this invention by reason of their ability to crystallize to electrically conductive forms in air at temperatures beginning at about 800° C. This avoids or minimizes the risk of oxidizing the austenitic alloy forming the support, leading to reduction of its flexibility and ductility as well as minimizing any risk of unwanted interactions between the support and crystalline oxide layer. By contrast, crystallization of RAC oxides are typically in the range of from about 900° to 1100° C. The TAA'C oxides typically require heating in the temperature range of 850° to 900° C.

The PAA'C oxides are also advantageous in that they require no special post-crystallization annealing or oxygen enrichment to achieve desirable high $T_c$ and superconductive properties. Generally crystallizations in air without resorting to any particular temperature ramping or atmosphere control on cooling are acceptable to achieve satisfactory conductivity characteristics.

Of the PAA'C oxides it is preferred to form those which exhibit 2-2-1-2 and 2-2-2-3 crystal structures. The latter exhibit the art recognized advantage of higher superconducting onset transition temperatures, but the former are often preferred in practice, since the 2-2-1-2 crystal structure is more stable and can therefore be prepared over a wider range of conditions and on a greater variety of substrate materials. More importantly, for this application the 2-2-1-2 crystalline forms of PAA'C oxides are preferred, since crystallizations can be effected with less thermal energy, reflected in somewhat lower temperatures, heating times or a combination of both.

All coating compositions and procedures known in the art to produce crystalline PAA'C oxide 2-2-1-2 and 2-2-2-3 crystal structures can be employed, subjected only to the requirement that crystallization temperatures be maintained below levels that would damage the support. Generally maintaining crystallization temperatures at or below about 850° C. in a time period of 10 minutes or less satisfy this requirement, although some of the more stable austenitic alloys are expected to resist oxidation under somewhat more severe crystallization conditions.

In PAA'C oxides P represents an atom of a heavy pnictide, typically bismuth and, optionally, less than 10 mole percent (preferably less than 5 mole percent) antimony. Lead has been suggested as a possible replacement for a minor amount of bismuth or antimony. A in the PAA'C oxide acronym typically represents strontium while A' typically represents calcium. Magnesium has been employed as a replacement for calcium, but is not preferred, since it reduces superconducting onset transition temperatures. At least a minor amount of strontium is sometimes replaced by barium. The alkaline earth metals are to a limited extent interchangeable in the crystalline lattice without adversely affecting electrical conductivity or superconductivity. Thus even though strontium and calcium, for example, do not satisfy a 2:1 or 1:1 molar ratio, the 2-2-1-2 and 2-2-2-3 crystal lattices, respectively, can nevertheless remain intact. C in the PAA'C oxide acronym is copper. It has been recently recognized that lithium can replace a minor amount of alkaline earth and/or copper in the crystal structure.

Specifically preferred PAA'C oxides are those that exhibit a crystal structure corresponding to that of superconductive 2-2-1-2 barium strontium calcium copper oxide. Preferred molar metal ratios of oxide compositions capable of forming the 2-2-1-2 crystal structure are defined by the formula:

$$P_2A_{3-y}A'_yC \quad (I)$$

where
y is 0.5 to 1.5 and
P, A, A' and C are as noted above.

Useful PAA'C oxides and procedures for forming coatings of these oxides are disclosed by EPO 0 334 098, cited above, which relates primarily to forming thin superconductive films having a thickness of 5 μm or less (preferably 1.0 μm or less); Strom U.S. Ser. No. 291,921, filed Dec. 29, 1988, now abandoned in favor of U.S. Ser. No. 556,520, filed July 20, 1990, titled SUPERCONDUCTING THICK FILMS FOR HYBRID CIRCUITRY APPLICATIONS, which relates to superconductive thick films having a thickness of at least 5 μm; West German published patent application 3,803,530; European published applications 0 330 305A, 0 331 292A and 0 330 324A; Japanese Kokai 1,192,759A (filed Jan. 26, 1988); and R. Dagani, "Improved Superconductor Properties, Technology Bring Applications Closer", C&EN, Jan. 1, 1990, pp. 24–27; the disclosures of which are here incorporated by reference.

Crystalline PAA'C oxide layer thicknesses are contemplated to be at least about 0.3 μm, preferably at least about 0.5 μm. For flexible articles it is preferred that the conductive crystalline oxide coatings be limited to less than about 10 μm in thickness, preferably less than 5 μm in thickness, and optimally less than 1 μm in thickness.

Another optional feature that can be employed to form the articles of this invention are crystal growth promoting agents. Lithium and sodium are both recognized to act as crystal growth promoting agents. These alkali metals in the form of thermally decomposable salts, preferably including an anionic portion that can be volatilized below crystallization temperatures, such as a carboxylate, halide, nitrate or the like, are contemplated. The crystal growth promoting agent can be incorporated in the PAA'C oxide layer as it is initially coated or coated over the composite barrier layer prior to forming the PAA'C oxide coating. Even if coated initially as a separate layer, no separate crystal growth promoting agent layer remains in the article after heating to crystallization temperatures.

Instead of employing an alkali metal salt as a crystal growth promoting agent, it is specifically contemplated to overcoat the composite barrier layer with silver prior to coating the PAA'C oxide layer. Silver accelerates crystal growth. It is believed that the silver provides nucleation sites for crystal formation on heating. Acceleration of crystal growth can be observed with silver coatings as thin 100 Å. However, it is generally preferred to employ silver coatings in thicknesses ranging from about 0.1 to 1 μm in thickness. Upon the completion of crystallization no continuous silver layer can be found at the interface of the barrier and the crystallized conductive PAA'C oxide layer.

The advantage of employing crystal growth promoting agents is that larger crystal sizes can be realized with less thermal energy input. This reduces the risk of oxidation of the austenitic alloy support and unwanted interactions between the support and the crystalline conductive oxide layer being formed.

While PAA'C oxide conductive layers are less susceptible to degradation on keeping in ambient air than RAC oxide superconductive coatings, the articles of this invention can nevertheless benefit by protecting the crystalline PAA'C oxide conductive layer from contact with contaminants, particularly the moisture in ambient air. One technique for achieving the desired protection is to mount the article in a hermetically sealed housing. Another technique is to encapsulate the crystalline PAA'C oxide layer by coating or molding a plastic encapsulant around the article, such as illustrated by external coating 209 in FIG. 2.

Chatterjee et al U.S. Ser. No. 290,670, filed Dec. 27, 1988, titled A SUPERCONDUCTIVE CERAMIC OXIDE COMBINATION, commonly assigned, now U.S. Pat. No. 4,997,804 reports that alkyl cellulose polymers and polyester ionomer polymers are effective to stabilize superconductive ceramic oxides while other polymers are ineffective.

Polyester ionomers are polyesters which contain at least one ionic moiety.

Such ionic moieties can be provided by either ionic diol recurring units or ionic dicarboxylic acid recurring units, but preferably by the latter. Such ionic moieties can be anionic or cationic in nature, but preferably, they are anionic. Exemplary ionic groups include carboxylic acid, sulfonic acid, quaternary ammonium, disulfonylimino groups, and their salts.

In a preferred form, the amorphous polyesters comprise from about 2 to about 25 mole percent, based on total moles of dicarboxylic acid recurring units, of ionic dicarboxylic acid recurring units.

Ionic dicarboxylic acids found to be particularly useful are those having units represented by the formula:

(II)

wherein each of m and n is 0 or 1 and the sum of m and n is 1; each X is carbonyl; Q has the formula:

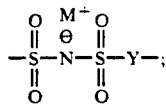

Q' has the formula:

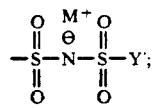

Y is a divalent aromatic radical, such as arylene (e.g. phenylene, naphthalene, xylylene, etc.) or arylidyne (e.g. phenenyl, naphthylidyne, etc.); Y' is a monovalent aromatic radical, such as aryl, aralkyl or alkaryl (e.g. phenyl, p-methylphenyl, naphthyl, etc.), or alkyl having from 1 to 12 carbon atoms, such as methyl, ethyl, isopropyl, n-pentyl, neopentyl, 2-chlorohexyl, etc., and preferably from 1 to 6 carbon atoms; and M is a solubilizing cation and preferably a monovalent cation such as an alkali metal or ammonium cation.

Exemplary preferred dicarboxylic acids and functional equivalents from which such ionic recurring units are derived are 3,3'-[(sodioimino)disulfonyl]dibenzoic acid; 3,3'-[(potassioimino)disulfonyl]dibenzoic acid; 3,3'-[(lithioimino)disulfonyl]dibenzoic acid; 4,4'-[(lithioimino)disulfonyl]dibenzoic acid; 4,4'-[(sodioimino)disulfonyl]dibenzoic acid; 4,4'-[(potassioimino)disulfonyl]dibenzoic acid; 3,4'-[(lithioimino)disulfonyl]dibenzoic acid; 3,4'-[(sodioimino)disulfonyl]dibenzoic acid; 5-[4-chloronaphth-1-ylsulfonyl(sodioimino)sulfonyl]isophthalic acid; 4,4'-[(potassioimino)disulfonyl]dinaphthoic acid; 5-[p-tolylsulfonyl(potassioimino)sulfonyl]isophthalic acid; 4-[p-tolylsulfonyl(sodioimino)sulfonyl]-1,5-naphthalenedicarboxylic acid; 5-[n-hexylsulfonyl(lithioimino)sulfonyl]isophthalic acid; 2-[phenylsulfonyl(potassioimino)sulfonyl]terephthalic acid and functional equivalents thereof. These and other dicarboxylic acid useful in forming preferred ionic recurring units are described in Caldwell et al U.S. Pat. No. 3,546,180, the disclosure of which is herein incorporated by reference.

Ionic dicarboxylic acid recurring units can also be derived from 5-sodiosulfobenzene-1,3-dicarboxylic acid, 5-sodiosulfocyclohexane-1,3-dicarboxylic acid, 5-(4-sodiosulfophenoxy)benzene-1,3-dicarboxylic acid, 5-(4-sodiosulfophenoxy)cyclohexane-1,3-dicarboxylic acid, similar compounds and functional equivalents thereof and others described in U.K. Patent Specification No. 1,470,059 (published Apr. 14, 1977).

The amorphous polyesters preferably comprise from about 75 to about 98 mole percent, based on total moles of dicarboxylic acid recurring units, of dicarboxylic acid recurring units which are nonionic in nature. Such nonionic units can be derived from any suitable dicarboxylic acid or functional equivalent which will condense with a diol as long as the resulting polyester is substantially amorphous. Preferably, such units have the formula:

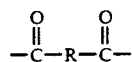

wherein R is a saturated or unsaturated divalent hydrocarbon. Preferably, R is alkylene of 2 to 20 carbon atoms, (e.g. ethylene, propylene, neopentylene, 2-chlorobutylene, etc.); cycloalkylene of 5 to 10 carbon atoms, (e.g. cyclopentylene, 1,3-cyclohexylene, 1,4-cyclohexylene, 1,4-dimethylcyclohexylene, etc.); or arylene of 6 to 12 carbon atoms, (e.g. phenylene, xylylene, etc.). More preferably, R is alkylene of 2 to 20 carbon atoms.

Such recurring units are derived from, for example, phthalic acid, isophthalic acid, terephthalic acid, malonic acid, succinic acid, glutaric acid, adipic acid, suberic acid, and 1,3-cyclohexane dicarboxylic acid and functional equivalents thereof. Dicarboxylic acids which have moieties that are sensitive to actinic radiation are also useful. Exemplary radiation sensitive dicarboxylic acids or functional equivalents thereof are described in Arcesi et al U.S. Pat. No. 3,929,489, the disclosure of which is herein incorporated by reference.

The dicarboxylic acid recurring units are linked in a polyester by recurring units derived from difunctional compounds capable of condensing with a dicarboxylic acid or a functional equivalent thereof. Such difunctional compounds include diols of the formula HO—R$^1$—OH wherein R$^1$ is a divalent aliphatic, alicyclic or aromatic radical of from 2 to 12 carbon atoms and includes hydrogen, carbon, and, optionally, ether oxygen atoms.

Such aliphatic, alicyclic, and aromatic radicals include alkylene, cycloalkylene, arylene, alkylenearylene, alkylenecycloalkylene, alkylenebisarylene, cycloalkylenebisalkylene, arylenebisalkylene, alkylene-oxyalkylene, alkylene-oxy-aryleneoxy-alkylene, arylene-oxy-alkylene, alkylene-oxycycloalkylene-oxy-alkylene, etc. Preferably, R$^1$ contains an ether linkage, such as in cycloalkyleneoxy-alkylene or alkylene-oxy-alkylene.

Exemplary diols include ethylene glycol, diethylene glycol, triethylene glycol, 1,3-propanediol, 1,4-butanediol, 2-methyl-1,5pentanediol, neopentyl glycol, 1,4-cyclohexanedimethanol, 1,4-bis($\beta$-hydroxyethoxy)cyclohexane, quinitol, norcamphanediols. 2,2,4,4-tetraalkylcyclobutane-1,3-diols, p-xylene diol and Bisphenol A.

In a preferred embodiment, the substantially amorphous polyesters described herein comprise diol recurring units of either of the formulae

or

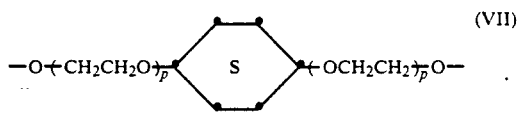

wherein p is an integer from 1 to 4. Such recurring units are present in the polyesters in an amount of at least 50 mole percent, and most preferably from about 50 to 100 mole percent, based on total moles of diol recurring units.

Particularly useful amorphous polyesters include
poly[1,4-cyclohexylenedi(oxyethylene)-3,3'-[sodioimino)disulfonyl]dibenzoate-co-succinate (5:95 molar ratio)]
poly[1,4-cyclohexylenedi(oxy-ethylene)-coethylene (75:25 molar ratio)]
poly{3,3'-[(potassioimino)disulfonyl]dibenzoate-co-azelate (10:90 molar ratio)} poly{1,4-cyclohexylenedi(oxyethylene)-3,3'-[(sodioimino)disulfonyl]-dibenzoate-co-adipate (95:5 molar ratio)}
poly{1,4-cyclohexylenedi(oxyethylene)-3,3'-[(sodioimino)disulfonyl]dibenzoate-co-3,3'-(1,4-phenylene)-dipropionate (20:80 molar ratio)} and
poly[p-phenylenebis(oxyethylene)-5-(4-sodiosulfo phenoxy)-1,3-benzenedicarboxylate-co-terephthalate (30:70 molar ratio)].

Other useful polyester ionomers are disclosed by Noonan et al U.S. Pat. Nos. 4,097,282, 4,291,153, 4,395,475 and 4,419,437 as well as Merrill et al U.S. Pat. No. 4,252,921, here incorporated by reference.

Since the crystalline PAA'C oxides are subject to degradation by moisture, it is particularly surprising that aqueous solutions of these polyester ionomers are effective to stabilize the superconductive ceramic oxides of this invention.

In addition to polyester ionomers it has been observed that alkyl cellulose polymers are also effective to stabilize the superconductive ceramic oxides. Generally any soluble alkyl cellulose can be employed. Preferred alkyl cellulose polymers are those in which the alkyl moiety contains from 1 to 10 carbon atoms, optimally from about 1 to 6 carbon atoms. These polymers are generally recognized to be soluble in most common organic solvents. Specific preferred examples of useful alkyl cellulose are methyl cellulose, ethyl cellulose, n-propyl cellulose, isobutyl cellulose, and n-hexyl cellulose.

EXAMPLES

The invention can be better appreciated by reference to the following detailed examples.

EXAMPLE 1

Austenitic stainless steel UNS number S30100, commonly referred to as 301, was employed as a starting material for forming the support of the article. The 301 stainless steel contained 0.15% carbon, 2.00% manganese, 1.00% silicon, 16-18% chromium, 6.0-8.0% nickel, 0.045% phosphorus and 0.03% sulfur, with the balance of the composition being iron. A flexible foil of the 301 stainless steel approximately 50 $\mu$m in thickness was formed by cold rolling a starting sample. Surface irregularities of the flexible foil were substantially limited to a height of less than 1 $\mu$m.

The flexible foil was degreased using acetone as a volatile organic solvent followed by rinsing with deionized water and dried. The foil surface was slightly oxidized by dipping into a concentrated hydrogen peroxide solution. A zirconium film of 1.5 $\mu$m in thickness was then deposited onto the flexible foil. The zirconium film was converted to a zirconia layer 2 to 2.5 $\mu$m in thickness by annealing in oxygen at 600° to 625° C. for 2 hours.

A magnesia layer having a thickness of about 2500 Å was next formed over the zirconia layer by spin casting a solution of magnesium 2-ethylhexanoate in 2-ethylhexanoic acid followed by thermal annealing at 850° C. for 5 minutes.

A 2-2-1-2 crystal structure $Bi_2Sr_2CaCu_2O_{8+}$ (where 8+ indicates more than 8 but less than 9 oxygen atoms—i.e., a slight stoichiometric excess) conductive layer was prepared by the following procedure:

A precursor composition containing the conductive oxide coating metals in the required proportions was prepared by mixing the organic precursor compounds bismuth 2-ethylhexanoate, strontium cyclohexanebutyrate, calcium 2-ethylhexanoate and copper 2-ethylhexanoate. The bismuth precursor was prepared as described in EPO 0 334 093, cited above, but with a somewhat varied rotary evaporator treatment that gave a bismuth concentration of 20.8 percent as determined by gravimetric analysis. The strontium cyclohexanebutyrate and calcium 2-ethylhexanoate were purchased from commercial sources and were received with an assay indicating a metal concentration of 19.4 and 5 percent, respectively. The precursor with a copper concentration of 6.31 percent was made by mixing 2.0 g of copper acetate with 8.0 g of 2-ethylhexanoic acid. The individual precursors were mixed in a weight ratio of 6:2.7:2.4:6.04 and dissolved in 2-ethylhexanoic acid by heating to boiling until no solids remained. The precursor composition had a copper concentration of $3.8 \times 10^{-4}$ mole per gram of solution. To enhance grain growth on crystallization a soluble sodium salt was added to the precursor composition to give a final sodium concentration of 2.3 to $3.4 \times 10^{-5}$ mole per gram of solution. Rosin (Kodak 2315 TM) was added as a film forming agent, and the precursor composition was heated slightly until the rosin went into solution.

The precursor composition was spin coated on the high density hafnia layer on the support at 4000 rpm for 20 seconds and then thermally ramped from room temperature to 550° C. in 10 minutes. After 5 minutes of annealing at 550° C., the sample was cooled to room temperature. This process was then repeated 6 times to produce a total of 7 layers, each having a thickness of approximately 0.4 $\mu$m.

After all the layers were formed the sample was further heat treated at 845° C. for 7.5 minutes to convert the layers to the desired superconducting 2-2-1-2 crystal structure. X-ray diffraction analysis revealed a highly oriented crystalline film with the crystal c-axes oriented normal to the substrate. The cuprate coating showed metallic conductivity before reaching its superconducting onset transition temperature at 90° K. Superconductivity was observed to commence at 64° to 65° K. It was found that the completed article could be bent to form an arc having a 10 mm diameter without cracking the conductive oxide coating.

EXAMPLE 2

This is a comparative example demonstrating the ineffectiveness of zirconia when employed alone without magnesia as described above. Except as specifically noted, the procedures of Example 1 were repeated, but with the notable difference that no magnesia layer was employed.

Electron beam zirconium deposits ranged from 0.5 to 3.0 $\mu$m. Conversions to zirconia were undertaken with annealing times ranging from 0.5 to 3.0 hours, depending upon layer thickness. Rutherford back scattering spectrometry showed well defined zirconia layers to be formed. Interactions between zirconia and the stainless steel support elements were limited to their interface, and, although containing fissures, large portions of the zirconia layers remained intact.

When the zirconium layer thickness was 0.5 $\mu$m, energy dispersing spectrometry revealed the presence of iron, chromium and nichol signals, which indicated that the zirconium did not form a continuous layer on the stainless steel support. Annealing for 0.5 hour at 600° C. completely converted the zirconium to zirconia, but did not result in a continuous zirconia layer. The cuprate oxide layer formed on the zirconia layer of this sample showed a much higher resistance at room temperature than the article produced by Example 1.

When the zirconium deposition was increased to 1.5 $\mu$m in thickness and annealed in oxygen at 600° C. for 3 hours, a zirconia layer was formed on the stainless steel support sample. The zirconia coated stainless steel support was slightly curved, and microscopically visible fissures were observed in the zirconia layer. Energy dispersing spectrometry revealed only a zirconium signal, indicating that the zirconia layer completely covered the stainless steel support sample.

Three layers were spin cast by the procedure of Example 1 followed by heating in air at 860° C. for 5 minutes. X-ray diffraction measurements indicated the presence of 2-2-1-2 bismuth strontium calcium copper oxide with trace amounts of other phases. Energy dispersing spectrometry indicated that the ratio of x-ray signals from the metals forming the 2-2-1-2 crystalline coating was close to those found for similar films deposited directly on monocrystalline magnesia. The observed resistance was 40 to 50 ohms per square at room temperature. Resistance increased slightly in decreasing temperature. While a superconducting onset temperature was observed at about 80° K., superconductivity was not been observed on investigation of lower temperatures down to 20° K. Thus, the absence of an auxiliary magnesia barrier led to a marked degradation of performance.

When the zirconium film thicknesses were increased into the range of from 2.5 to 3.0 $\mu$m, thermal oxidation resulted in the zirconia spalling from the support due to excessive interfacial stress levels. No useful article could be formed.

EXAMPLE 3

This is a comparative example demonstrating the ability of hafnia alone to form an effective barrier. The hafnia barrier is the subject of the copending patent application referenced above. The purpose of this example is therefore to demonstrate the capability of the procedure to form an effective barrier with a material other than zirconia.

Example 1 was repeated, but with the following procedure for depositing hafnia substituted for the procedure of Example 1 for forming zirconia and magnesia layers.

A sample of the degreased flexible foil was loaded into an evacuated hafnia coating chamber maintained at a pressure of about 1 to $2 \times 10^{-6}$ torr. To assure a clean deposition surface the flexible foil was lightly etched with an ion beam. A general description of the coating procedure employed is provided by J. J. Cuomo and S. M. Rossnazol, *Nucl. Instr. and Meth.*, B19/20, 903 (1987). A high density hafnia barrier layer having a thickness in the range of from 1.5 to 1.8 $\mu$m was deposited on the cleaned flexible foil at a temperature of 240° to 260° C. by electron beam evaporation of hafnia (99% purity) at a fixed rate of 0.2 to 0.4 nm/sec. To prevent a space charge induced oxygen deficiency a gas stream consisting of 95% Ar and 5% $O_2$ supplied from a $1 \times 10^{-4}$ Torr. source was passed by a tungsten charge neutralizer filament heated by an electric current and then brought into contact with the hafnia layer as it was being deposited. This improved the adhesion of the hafnia to the flexible foil and annealed localized stresses out of the hafnia layer.

The hafnia layer as initially deposited was in a tetragonal crystal structure and was transformed into a monoclinic crystal structure by annealing at 600° C. for one hour. Scanning electron microscopy revealed a high density hafnia layer devoid of microcracks or other visible discontinuities.

After all the layers were formed the sample was further heat treated at 845° C. for 5 to 10 minutes to convert the layers to the desired superconducting 2-2-1-2 crystal structure. X-ray diffraction analysis revealed a highly oriented crystalline film with the crystal c-axes oriented normal to the substrate. The sheet resistance of the conductive oxide coating was about 4 ohms/square at room temperature. Below ambient temperature resistance measurements revealed excellent electrical characteristics. The superconducting onset transition temperature $T_c$ was in the vicinity of 85° K., with $T_o$ being about 70° to 73° K. The critical current density at 4° K. was about $1 \times 10^3$ A/cm$^2$.

EXAMPLE 4

This is a comparative example demonstrating the ineffectiveness of zirconia when substituted for hafnia in a preparation process shown to be effective for producing a barrier layer.

Example 3 was repeated, except that zirconia was substituted for hafnia. The crystalline oxide coating produced was nonconducting. Neither a superconducting onset transition temperature nor superconductivity was observed. Failure was attributed to cracking of the zirconia layers at the elevated temperatures required to form the crystalline oxide film.

EXAMPLE 5

This is a comparative example demonstrating the ineffectiveness of magnesia when substituted for hafnia in a preparation process shown to be effective for producing a barrier layer.

Example 3 was repeated, except that magnesia was substituted for hafnia. A useful coated article could not be produced. The bismuth strontium calcium copper oxide coating peeled from the support on heating to crystallization temperatures. This was attributed to a thermal expansion mismatch between the magnesia and the cuprate layers.

EXAMPLE 6

This is a comparative example demonstrating the necessity of a barrier layer.

Example 1 was repeated, except that the steps of forming the barrier layer were omitted. The crystalline oxide coating produced was nonconducting. Neither a superconducting onset transition temperature nor superconductivity was observed. Failure was attributed to contamination of the crystalline oxide coating by the austenitic alloy support.

The invention has been described in detail with particular reference to preferred embodiments thereof, but it will be understood that variations and modifications can be effected within the spirit and scope of the invention.

What is claimed is:

1. An article comprised of
    a support,
    a barrier and
    an electrically conductive crystalline coating comprised of a heavy pnictide mixed alkaline earth copper oxide capable of crystallization to a 2-2-1-2 or 2-2-2-3 crystal structure at a temperature of 850° C. or less in a time period of 10 minutes or less, characterized in that the support is comprised of an austenitic alloy of chromium and one or more group VIII period 4 metals and the barrier is comprised of a zirconia layer containing stress relief fissures created by heating the support and the zirconia layer to a temperature of at least 550° C. and located in the fissures an oxide compatible with crystallization of the heavy pnictide mixed alkaline earth copper oxide in an electrically conductive form chosen from among magnesia, hafnia, strontium titanate, lanthanum aluminate and potassium tantalate.

2. An article according to claim 1 further characterized in that said support is flexible and elongated along one major axis.

3. An article according to claim 2 further characterized in that said flexible support has a thickness in the range of from about 5 to 500 μm.

4. An article according to claim 3 further characterized in that said flexible support has a thickness in the range of from about 10 to 300 μm.

5. An article according to claim 2 further characterized in that said support is comprised of a flexible tape.

6. An article according to claim 2 further characterized in that said support is comprised of a flexible wire.

7. An article according to claim 1 further characterized in that said support is comprised of austenitic stainless steel.

8. An article according to claim 1 further characterized in that said crystalline coating is comprised of a superconductive crystalline 2-2-2-3 bismuth strontium calcium copper oxide.

9. An article according to claim 1 further characterized in that said crystalline coating is comprised of a superconductive crystalline 2-2-1-2 bismuth strontium calcium copper oxide.

10. An article according to claim 1 further characterized in that said compatible oxide located in the fissures is selected from among alkaline earth oxides.

11. An article according to claim 10 further characterized in that said compatible oxide located in the fissures is selected from among magnesia and strontium titanate.

12. An article according to claim 1 further characterized in that a silver layer for promoting crystallization is located between said barrier layer and said conductive layer.

13. A flexible electrically conductive article comprised of a support, a barrier coated on said flexible support, and a uniform metal oxide coating which exhibits a superconducting transition temperature in excess of 80° K. containing a superconductive crystalline 2-2-1-2 or 2-2-2-3 bismuth strontium calcium copper oxide, characterized in that said support is resistant to oxidation in air when heated to a temperature of at least 800° C. for 10 minutes and is comprised of a metal alloy exhibiting a face centered cubic crystal structure comprised of one or more Group VIII periode 4 metals and from 5 to 30 percent by weight chromium and said barrier is comprised of a zirconia layer of from 1 to 2.5 μm thickness containing stress relief fissures created by heating the support and the zirconia layer to a temperature of at least 600° C. and at least one of magnesia and strontium titanate located in the fissures.

* * * * *